(12) United States Patent
Sun et al.

(10) Patent No.: US 11,049,564 B2
(45) Date of Patent: Jun. 29, 2021

(54) ERASABLE PROGRAMMABLE NON-VOLATILE MEMORY

(71) Applicant: eMemory Technology Inc., Hsin-Chu (TW)

(72) Inventors: Wein-Town Sun, Hsinchu County (TW); Hsueh-Wei Chen, Hsinchu County (TW); Chun-Hsiao Li, Hsinchu County (TW); Wei-Ren Chen, Hsinchu County (TW); Hong-Yi Liao, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/803,585

(22) Filed: Feb. 27, 2020

(65) Prior Publication Data

US 2020/0294593 A1 Sep. 17, 2020

Related U.S. Application Data

(60) Provisional application No. 62/817,568, filed on Mar. 13, 2019.

(30) Foreign Application Priority Data

Jan. 7, 2020 (TW) .................................. 109100414

(51) Int. Cl.
*G11C 16/00* (2006.01)
*G11C 16/04* (2006.01)
(Continued)

(52) U.S. Cl.
CPC .......... *G11C 16/0433* (2013.01); *G11C 16/10* (2013.01); *G11C 16/14* (2013.01);
(Continued)

(58) Field of Classification Search
CPC ............ G11C 16/0408; G11C 16/0425; G11C 16/0433; G11C 16/0441; G11C 16/045;
(Continued)

(56) References Cited

U.S. PATENT DOCUMENTS 5,197,028 A 3/1993 Nakai
5,386,132 A * 1/1995 Wong .................. G11C 11/5621
257/316

(Continued)

*Primary Examiner* — Alfredo Bermudez Lozada
(74) *Attorney, Agent, or Firm* — WPAT, PC (57) ABSTRACT

An erasable programmable non-volatile memory includes a memory array and a sensing circuit. The memory array includes a general memory cell and a reference memory cell, which are connected with a word line. The sensing circuit includes a current comparator. The read current in the program state of the general memory cell is higher than the read current in the program state of the reference memory cell. The erase efficiency of the general memory cell is higher than the erase efficiency of the reference memory cell. When a read action is performed, the general memory cell generates a read current to the current comparator, and the reference memory cell generates a reference current to the current comparator. According to the reference current and the read current, the current comparator generates an output data signal to indicate a storage state of the general memory cell.

12 Claims, 9 Drawing Sheets

(51) Int. Cl.
 *G11C 16/26* (2006.01)
 *G11C 16/14* (2006.01)
 *H01L 27/11521* (2017.01)
 *G11C 16/10* (2006.01)

(52) U.S. Cl.
 CPC ........ *G11C 16/26* (2013.01); *H01L 27/11521* (2013.01); *G11C 2216/04* (2013.01)

(58) Field of Classification Search
 CPC ..... G11C 16/0458; G11C 16/00; G11C 16/10; G11C 16/14; G11C 16/26; G11C 2216/04
 See application file for complete search history.

(56) References Cited

U.S. PATENT DOCUMENTS

| | | | |
|---|---|---|---|
| 5,390,147 A | | 2/1995 | Smarandoiu et al. |
| 5,754,475 A | | 5/1998 | Bill et al. |
| 6,709,925 B1 | * | 3/2004 | Choi ................. H01L 29/42324 438/257 |
| 8,592,886 B2 | | 11/2013 | Hsu et al. |
| 2003/0156457 A1 | * | 8/2003 | Ooishi ................... G11C 16/28 365/185.21 |
| 2012/0235222 A1 | * | 9/2012 | Kamigaichi ...... H01L 27/11519 257/324 |
| 2014/0112080 A1 | * | 4/2014 | Carissimi ........... G11C 16/0441 365/189.07 |

* cited by examiner

| | Effective floating gate region | | Effective erase gate region | | Floating gate coupling ratio |
|---|---|---|---|---|---|
| | W(μm) | L(μm) | W(μm) | L(μm) | |
| Cell1 | 0.6 | 0.45 | 0.18 | 0.18 | 89.3% |
| Cell2 | 0.28 | 0.45 | 0.2 | 0.18 | 77.8% |
| Cell3 | 0.28 | 0.45 | 0.325 | 0.18 | 68.3% |
| Cell4 | 0.28 | 0.45 | 0.45 | 0.18 | 60.9% |

ERASABLE PROGRAMMABLE NON-VOLATILE MEMORY

This application claims the benefit of U.S. provisional application Ser. No. 62/817,568, filed Mar. 13, 2019 and Taiwan Patent Application No. 109100414, filed Jan. 7, 2020, the subject matters of which are incorporated herein by reference.

The present invention relates to a non-volatile memory, and more particularly to an erasable programmable non-volatile memory.

BACKGROUND OF THE INVENTION

Figures 1A, 1B, 1C, 1D:
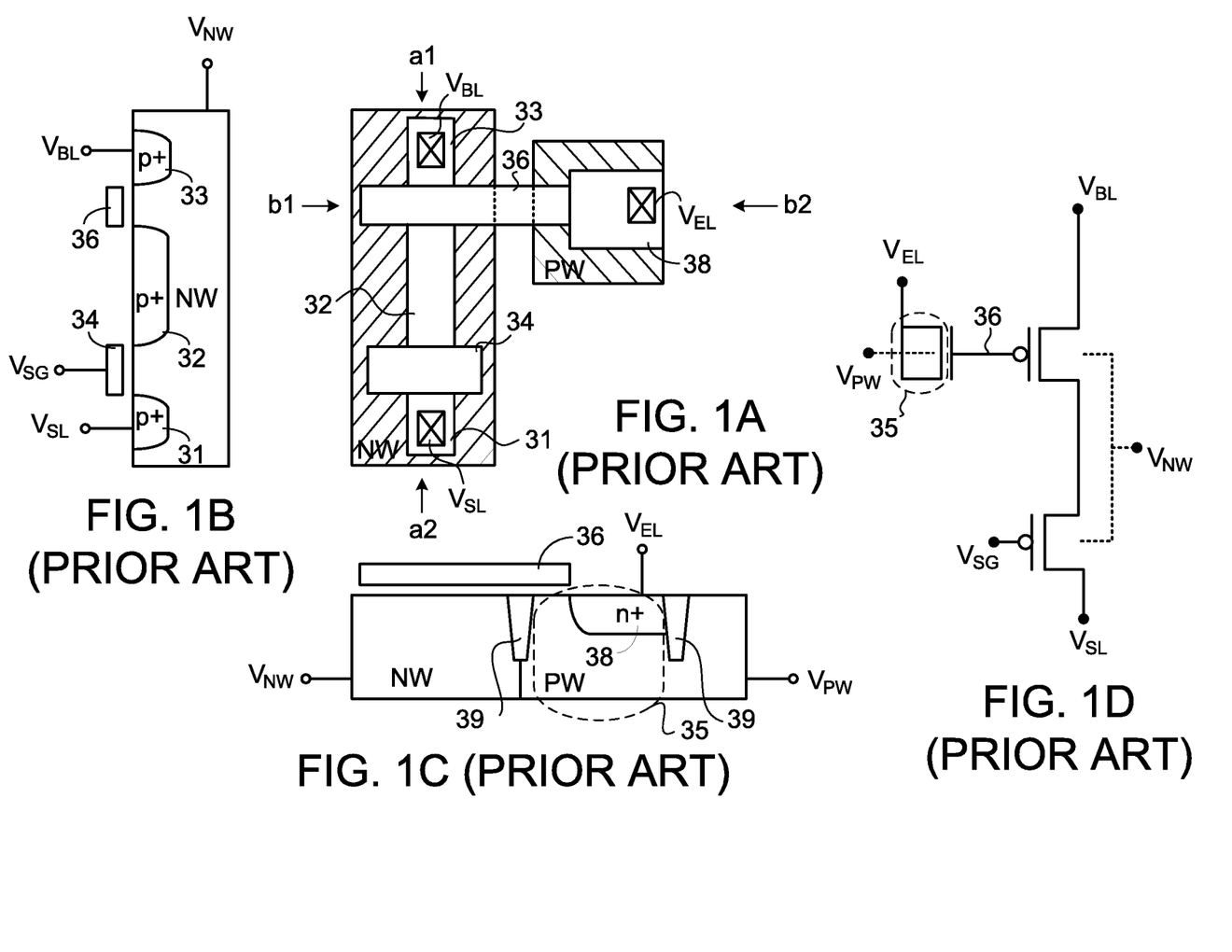
FIGS. 1A-1D (prior art) schematically illustrate the structure and the equivalent circuit of a memory cell of a conventional erasable programmable non-volatile memory.

FIGS. 1A-1D schematically illustrate the structure and the equivalent circuit of a memory cell of a conventional erasable programmable non-volatile memory. For example, the conventional erasable programmable non-volatile memory is disclosed in U.S. Pat. No. 8,592,886. FIG. 1A is a schematic top view illustrating the memory cell of the conventional erasable programmable non-volatile memory. FIG. 1B is a schematic cross-sectional view illustrating the memory cell of FIG. 1A and taken along a first direction (a1-a2). FIG. 1C is a schematic cross-sectional view illustrating the memory cell of FIG. 1A and taken along a second direction (b1-b2). FIG. 1D is a schematic equivalent circuit diagram of the memory cell.

As shown in FIGS. 1A and 1B, the memory cell of the conventional non-volatile memory comprises two serially-connected p-type transistors. The two p-type transistors are constructed in an n-type well region (NW). Three p-type doped regions 31, 32 and 33 are formed in the n-type well region (NW). In addition, two polysilicon gates 34 and 36 are spanned over the regions between the three p-type doped regions 31, 32 and 33.

The first p-type transistor is used as a select transistor, and the polysilicon gate 34 (also referred as a select gate) of the first p-type transistor is connected to a select gate voltage $V_{SG}$. The p-type doped region 31 is connected to a source line voltage $V_{SL}$. The p-type doped region 32 is a combination of a p-type doped drain region of the first p-type transistor and a p-type doped region of the second p-type transistor. The second p-type transistor is a floating gate transistor. The polysilicon gate 36 (also referred as a floating gate) is disposed over the second p-type transistor. The p-type doped region 33 is connected to a bit line voltage $V_{BL}$. Moreover, the n-type well region (NW) is connected to an n-well voltage $V_{NW}$.

As shown in FIGS. 1A and 1C, the memory cell of the conventional non-volatile memory further comprises an n-type transistor. The n-type transistor is composed of the floating gate 36 and an erase gate region 35. The n-type transistor is constructed in a p-type well region (PW). An n-type doped region 38 is formed in the p-type well region (PW). That is, the erase gate region 35 contains the p-type well region (PW) and the n-type doped region 38.

As shown in FIG. 1A, the floating gate 36 is extended externally and located near the erase gate region 35. Consequently, the floating gate 36 is also the gate terminal of the n-type transistor. Moreover, the n-type doped region 38 may be considered as a combination of an n-type doped source region and an n-type doped drain region. The n-type doped region 38 is connected to an erase line voltage $V_{EL}$. In addition, the p-type well region (PW) is connected to a p-well voltage $V_{PW}$. As shown in FIG. 1C, the erase gate region 35 and the n-type well region (NW) are isolated from each other by an isolation structure 39. For example, the isolation structure 39 is a shallow trench isolation (STI) structure.

As shown in the equivalent circuit of FIG. 1D, the non-volatile memory comprises a select transistor, a floating gate transistor and an n-type transistor. The select transistor and the floating gate transistor are p-type transistors and constructed in the n-type well region (NW). The n-type well region (NW) receives the n-well voltage $V_{NW}$. The n-type transistor is constructed in the p-type well region (PW). In addition, the p-type well region (PW) receives the p-well voltage $V_{PW}$.

The select gate of the select transistor receives the select gate voltage $V_{SG}$. The first source/drain terminal of the select transistor receives the source line voltage $V_{SL}$. The first source/drain terminal of the floating gate transistor is connected with the second source/drain terminal of the select transistor. The second source/drain terminal of the floating gate transistor receives the bit line voltage $V_{BL}$. The gate terminal of the n-type transistor and the floating gate of the floating gate transistor are connected with each other. The first source/drain terminal of the n-type transistor and the second source/drain terminal of the n-type transistor are connected with each other to receive the erase line voltage $V_{EL}$.

In case that different magnitudes of the select gate voltage $V_{SG}$, the source line voltage $V_{SL}$, the erase line voltage $V_{EL}$ and the bit line voltage $V_{BL}$ are provided to the memory cell of the erasable programmable non-volatile memory, electrons are controlled to be injected into the floating gate of the floating gate transistor or ejected from the floating gate of the floating gate transistor.

After the electrons are injected into the floating gate of the floating gate transistor, the memory cell is in a programmed state. After the electrons are ejected from the floating gate of the floating gate transistor, the memory cell is in an erased state.

Figure 2A:
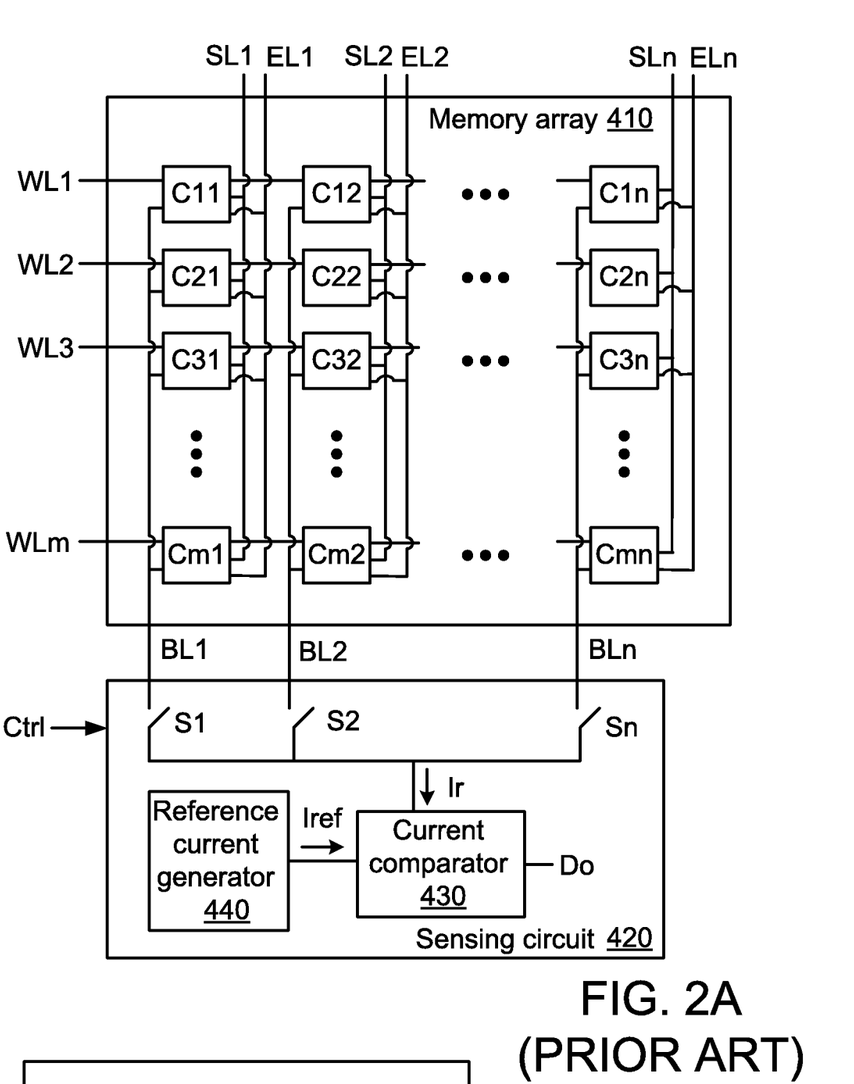
FIG. 2A (prior art) is a schematic circuit diagram illustrating a conventional erasable programmable non-volatile memory.

Moreover, plural memory cells of the erasable programmable non-volatile memory may be collaboratively formed as a memory array. FIG. 2A is a schematic circuit diagram illustrating a conventional erasable programmable non-volatile memory. The erasable programmable non-volatile memory comprises a memory array 410 and a sensing circuit 420. The memory array 410 comprises m×n memory cells C11~Cmn. The structure of each memory cell is identical to the structure of the memory cell as shown in FIG. 1D.

The memory array 410 comprises m word lines WL1~WLm, n bit lines BL1~BLn, n source lines SL1~SLn and n erase lines EL1~ELn. A select gate voltage $V_{SG}$ is provided to the word lines WL1~WLm. A source line voltage $V_{SL}$ is provided to the source lines SL1~SLn. An erase line voltage $V_{EL}$ is provided to the erase lines EL1~ELn. A bit line voltage $V_{BA}$ is provided to the bit lines BL1~BLn.

Each of the word lines WL1~WLm is connected with a corresponding row of n memory cells. The n memory cells in each row are connected with the n source lines SL1~SLn, the n erase lines EL1~ELn and the n bit lines BL1~BLn, respectively. For example, the word line WL2 is connected with the n memory cells C21~C2n in the second row. Moreover, the n memory cells C21~C2n are connected with the n source lines SL1~SLn, the n erase lines EL1~ELn and the n bit lines BL1~BLn, respectively.

Generally, each of the memory cells C11~Cmn in the memory array 410 may be programmed to be in a programmed state or erased to be in an erased state.

The sensing circuit 420 comprises a switch set, a current comparator 430 and a reference current generator 440. The switch set comprises n switches S1~Sn. According to a control signal Ctrl, one of the switches S1~Sn is controlled to be in a close state, and the other switches are controlled to be in an open state. The sensing circuit 420 can judge whether the selected memory cell of the memory array 410 is in the programmed state or the erased state.

During a read action, the select gate voltage $V_{SG}$ is provided to the word line WL2. Consequently, the word line WL2 is activated, and the row of the n memory cells C21~C2n connected with the word line WL2 is a selected row. For example, if the switch S2 is in the close state and the other switches are in the open state according to the control signal Ctrl, the memory cell C22 is the selected memory cell. The selected memory cell C22 is connected with the current comparator 430 through the bit line BL2.

When proper magnitudes of the source line voltage $V_{SL}$, the erase line voltage $V_{EL}$ and the bit line voltage $V_{BL}$ are respectively provided to the source line SL2, the erase line EL2 and the bit lines BL, a read current Ir generated by the selected memory cell C22 is transmitted to the current comparator 430 through the bit line BL2. According to the result of comparing the read current Ir with a reference current Iref, the current comparator 430 issues an output data signal Do to indicate the storage state of the selected memory cell C22.

For example, if the read current Ir generated by the selected memory cell C22 is higher than the reference current Iref, the output data signal Do is in a first logic level state to indicate that the selected memory cell C22 is in the programmed state. Whereas, if the read current Ir generated by the selected memory cell C22 is lower than the reference current Iref, the output data signal Do is in a second logic level state to indicate that the selected memory cell C22 is in the erased state.

According to the control signal Ctrl, the other selected memory cells in the selected row can be determined. Similarly, the current comparator 430 can determine the storage states of the memory cells by the above method.

Figure 2B:
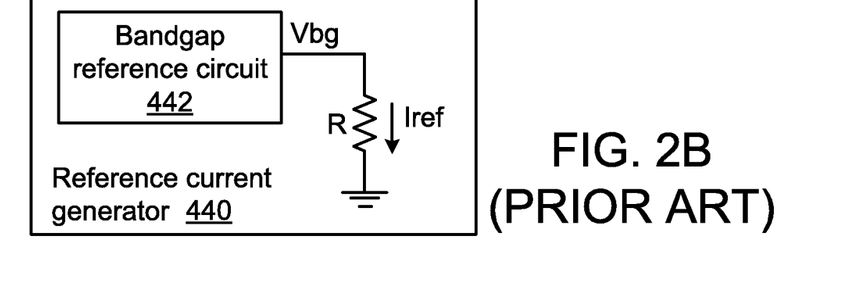
FIG. 2B (prior art) is a schematic circuit diagram illustrating the reference current generator of the conventional erasable programmable non-volatile memory.

FIG. 2B is a schematic circuit diagram illustrating the reference current generator of the conventional erasable programmable non-volatile memory. As shown in FIG. 2B, the reference current generator 440 comprises a bandgap reference circuit 442 and a resistor R. The bandgap reference circuit 442 generates a bandgap voltage Vbg to the resistor R. Consequently, the reference current Iref is generated, i.e., Iref=Vbg/R.

Generally, due to the variation of the semiconductor manufacturing process, the erase count and the operating temperature, the magnitude of the read current Ir generated by the memory cell of the memory array 410 may be varied. Moreover, the resistor R of the reference current generator 440 is a polysilicon resistor. The variation of the resistor R may result in the variation of the reference current Iref.

Preferably, the read current Ir is high enough when the memory cell is in the programmed state, and the read current Ir is low enough when the memory cell is in the erased state. For achieving this purpose, it is important to increase the size of the memory cell. Consequently, even if the reference current Iref is subjected to variation, the current comparator 430 is still able to confirm whether the memory cell is in the programmed state or the erased state according to the read current Ir of the memory cell and the reference current Iref.

However, as the size of the memory cell increases, the layout area of the memory array 410 increases. Under this circumstance, the applications of the non-volatile memory are impaired.

SUMMARY OF THE INVENTION

An embodiment of the present invention provides an erasable programmable non-volatile memory. The erasable programmable non-volatile memory includes a memory array and a sensing circuit. The memory array includes a first array region and a second array region. A first word line is connected with a first row of n general memory cells in the first array region. The first word line is connected with a first reference memory cell in the second array region. The memory array further includes n general bit lines, n general erase lines, n general source lines, a reference bit line, a reference erase line and a reference source line. The first row of n general memory cells are respectively connected with the n general bit lines, the n general erase lines and the n general source lines. The first reference memory cell is connected with the reference bit line, the reference erase line and the reference source line. A read current in the program state of each general memory cell is higher than a read current in the program state of the first reference memory cell. An erase efficiency of each general memory cell is higher than an erase efficiency of the first reference memory cell. The sensing circuit includes a switch set and a current comparator. The switch set is connected with the n general bit lines and the reference bit line. The current comparator is connected with the switch set. When a read action is performed and the first word line is activated, one of the n general bit lines and the reference bit line are connected with the current comparator through the switch set according to a control signal. Consequently, the first row of n general memory cells is determined as a first selected general memory cell, and the first reference memory cell is determined as a first selected reference memory cell. The first selected general memory cell generates a first read current to the current comparator. The first selected reference memory cell generates a first reference current to the current comparator. The current comparator generates an output data signal according to the first reference current and the first read current.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3:
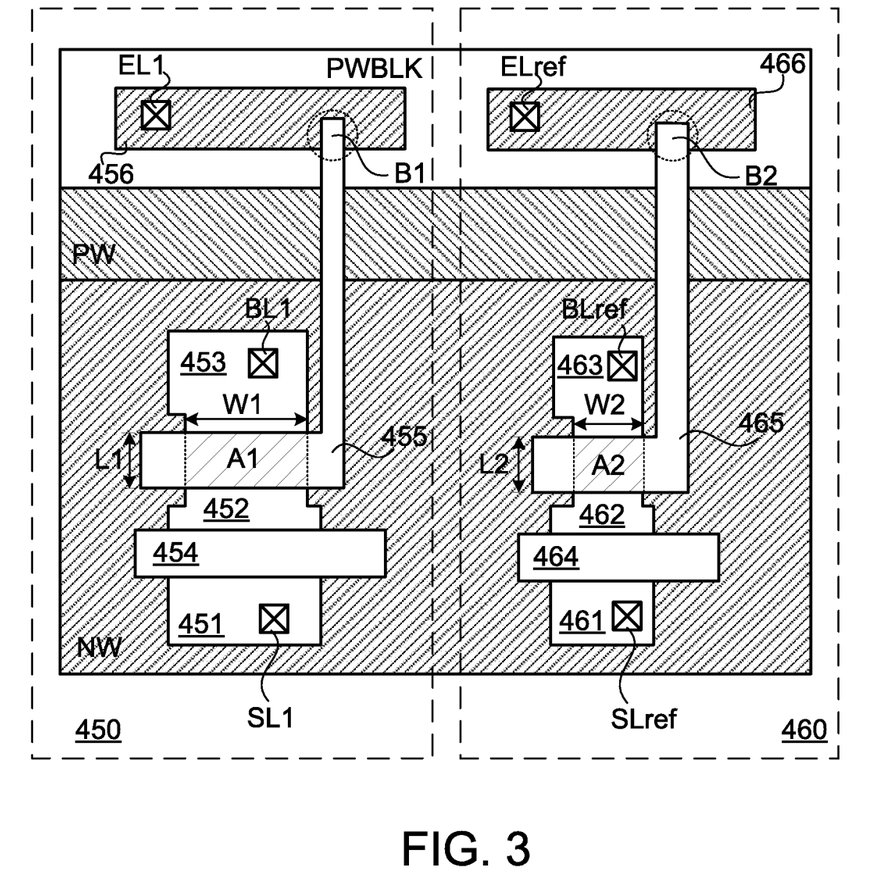
FIG. 3 is a schematic top view illustrating a first type memory cell and a second type memory cell of an erasable programmable non-volatile memory according to an embodiment of the present invention.

FIG. 3 is a schematic top view illustrating a first type memory cell and a second type memory cell of an erasable programmable non-volatile memory according to an embodiment of the present invention. As shown in FIG. 3, the erasable programmable non-volatile memory comprises a first type memory cell 450 and a second type memory cell 460.

The first type memory cell 450 comprises two serially-connected p-type transistors. The two p-type transistors are constructed in an n-type well region (NW). Three p-type doped regions 451, 452 and 453 are formed in the n-type well region (NW). In addition, two polysilicon gates 454 and 455 are spanned over the regions between the three p-type doped regions 451, 452 and 453.

The first p-type transistor of the first type memory cell 450 is used as a select transistor. Moreover, the first p-type transistor comprises the polysilicon gate 454 (also referred as a select gate), the p-type doped region 451 and the p-type doped region 452. The p-type doped region 451 is connected with a source line SL1.

The second p-type transistor of the first type memory cell 450 is used as a floating gate transistor. Moreover, the second p-type transistor comprises the polysilicon gate 455 (also referred as a floating gate), the p-type doped region 452 and the p-type doped region 453. The p-type doped region 453 is connected with a bit line BL1.

The floating gate 455 is extended externally to cover the n-type well region (NW), a p-type well region (PW) and an n-type doped region 456 so as to define an erase gate region. The n-type doped region 456 is connected with an erase line ED. Optionally, a p-type block region PWBLK is formed between the p-type well region (PW) and the n-type doped region 456.

The second type memory cell 460 comprises two serially-connected p-type transistors and an erase gate region.

The first p-type transistor of the second type memory cell 460 is used as a select transistor. Moreover, the first p-type transistor comprises a select gate 464, a p-type doped region 461 and a p-type doped region 462. The second p-type transistor of the second type memory cell 460 is used as a floating gate transistor. Moreover, the second p-type transistor comprises a floating gate 465, a p-type doped region 462 and a p-type doped region 463. The floating gate 465 is extended externally to cover the n-type well region (NW), the p-type well region (PW) and an n-type doped region 466 so as to define the erase gate region. The p-type doped region 461 is connected with a source line SLref. The p-type doped region 463 is connected with a bit line BLref. The n-type doped region 466 is connected with an erase line ELref.

The equivalent circuit diagram of the first type memory cell 450 and the second type memory cell 460 is similar to the equivalent circuit diagram of FIG. 1D, and is not redundantly described herein. In accordance with a feature of the present invention, the effective floating gate areas and the effective erase gate areas of the first type memory cell 450 and the second type memory cell 460 are different.

Generally, the effective floating gate area is an overlapping region of the floating gate overlying a channel region of the floating gate transistor, and the effective erase gate area is an overlapping region of the floating gate overlying the n-type doped region.

The effective floating gate area of the first type memory cell 450 is A1, and the effective erase gate area of the first type memory cell 450 is B1. The effective floating gate area may be expressed as: A1=W1×L1, wherein W1 is a channel width of the floating gate transistor, and L1 is a channel length of the floating gate transistor. The effective floating gate area of the second type memory cell 460 is A2, and the effective erase gate area of the second type memory cell 460 is B2. The effective floating gate area may be expressed as: A2=W2×L2, wherein W2 is a channel width of the floating gate transistor, and L2 is a channel length of the floating gate transistor.

In this context, the percentage of the effective floating gate area divided by the sum of the effective floating gate area and the effective erase gate area is defined as a coupling ratio of the floating gate of the memory cell. That is, the coupling ratio of the floating gate of the first type memory cell 450 is equal to A1/(A1+B1), and the coupling ratio of the floating gate of the second type memory cell 460 is equal to A2/(A2+B2).

Generally, the effective floating gate area, the effective erase gate area and the coupling ratio of the floating gate of the memory cell may influence the read current in the program state, the erase efficiency and the corresponding read current of the memory cell. The reasons will be described as follows.

Figure 4A:
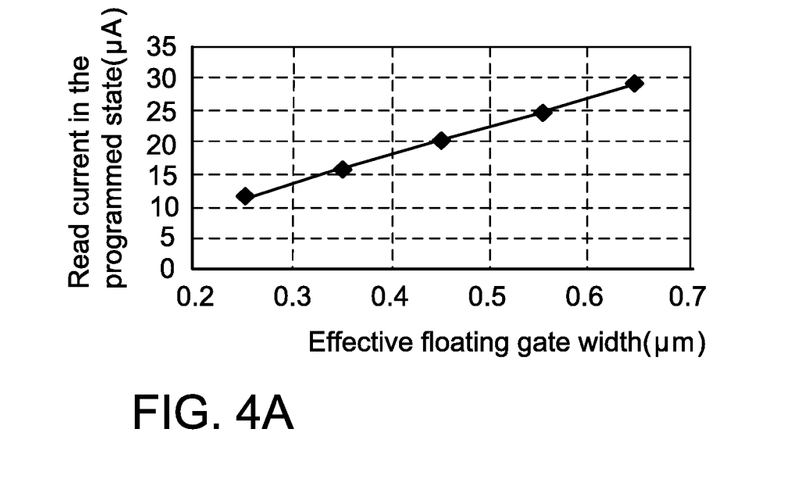
FIG. 4A is a plot illustrating the relationship between the effective floating gate widths of different memory cells and the corresponding read currents in the programmed state.

FIG. 4A is a plot illustrating the relationship between the effective floating gate widths of different memory cells and the corresponding read currents in the programmed state.

Please refer to FIG. 4A. In case that the channel length is fixed, the increase of the effective floating gate width may increase the area of the effective floating gate area. When the memory cell is in the programmed state, the magnitude of the read current generated by the memory cell with the larger effective floating gate width is higher and the magnitude of the read current generated by the memory cell with the smaller effective floating gate width is lower.

In other words, after the identical program voltage is applied to the memory cell to perform the program action, the read current in the program state of the memory cell with the larger effective floating gate width is higher. Consequently, more hot carriers are injected into the floating gate, and the magnitude of the read current generated by the memory cell with the larger effective floating gate width is higher. Whereas, the read current at program state of the memory cell with the smaller effective floating gate width is lower. Consequently, less hot carriers are injected into the floating gate, and the magnitude of the read current generated by the memory cell with the smaller effective floating gate width is lower.

Figure 4B:
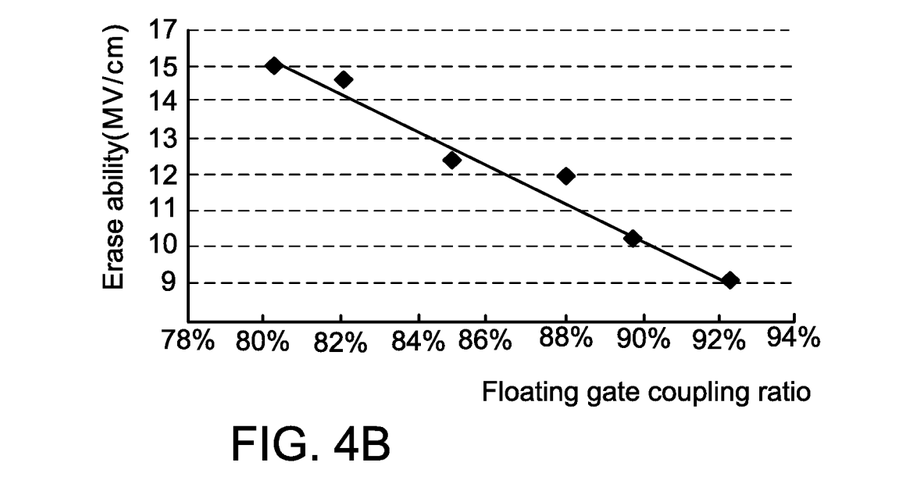
FIG. 4B is a plot illustrating the relationship between the coupling ratio of the floating gate and the erase ability.

FIG. 4B is a plot illustrating the relationship between the coupling ratio of the floating gate and the erase ability. It is assumed that the thickness of the gate oxide layer of the erase gate region is 100 Å (angstrom).

Please refer to FIG. 4B. For allowing the erase gate region to generate the sufficient electric field to eject the hot carriers from the floating gate, the memory cell whose floating gate coupling ratio is 80% has to receive the erase voltage of 15V and the memory cell whose floating gate coupling ratio is 92% has to receive the erase voltage of 9V.

Moreover, after the identical erase voltage is applied to the memory cell to perform the erase action, the erase efficiency of the memory cell with the larger floating gate coupling ratio is higher. Consequently, more hot carriers are rejected from the floating gate, and the magnitude of the read current is lower. Whereas, the erase efficiency of the memory cell with the smaller floating gate coupling ratio is lower. Consequently, less hot carriers are rejected from the floating gate, and the magnitude of the read current is higher.

FIGS. 5A, 5B, 5C and 5D schematically illustrate the characteristics of four memory cells with different types. Except for the effective floating gate area and the effective erase gate area, the structure of each of the four memory cells cell1, cell2, cell3 and cell4 is similar to the structure of the memory cell as shown in FIG. 3A.

Figure 5A:
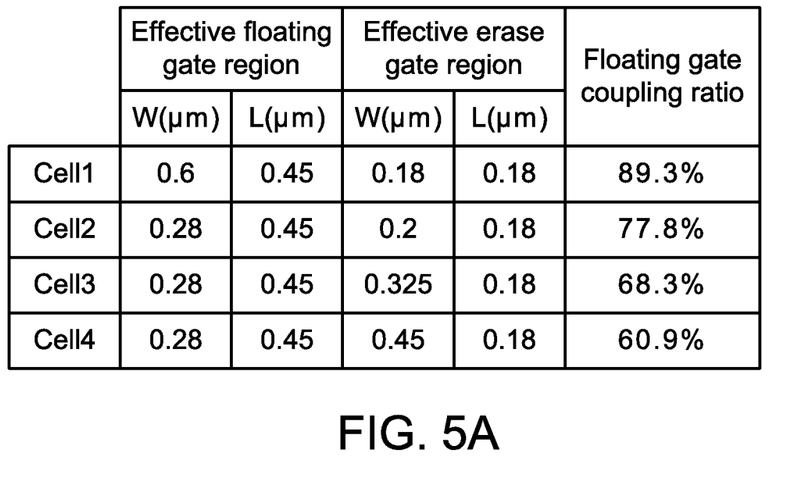
FIGS. 5A, 5B, 5C and 5D schematically illustrate the characteristics of four memory cells with different types.

Please refer to FIG. 5A. The channel width and the channel length of the floating gate transistor in the memory cell cell1 are 0.6 μm and 0.45 μm, respectively. That is, the effective floating gate area is equal to 0.6 μm×0.45 μm. Moreover, the effective erase gate area is equal to 0.18 μm×0.18 μm. Consequently, the floating gate coupling ratio of the memory cell cell1 is 89.3%.

Please refer to FIG. 5A again. The effective floating gate area of the memory cell cell2 is equal to 0.28 μm×0.45 μm. Moreover, the effective erase gate area of the memory cell cell2 is equal to 0.2 μm×0.18 μm. Consequently, the floating gate coupling ratio of the memory cell cell1 is 77.8%.

Please refer to FIG. 5A again. The effective floating gate area of the memory cell cell3 is equal to 0.28 μm×0.45 μm. Moreover, the effective erase gate area of the memory cell cell3 is equal to 0.325 μm×0.18 μm. Consequently, the floating gate coupling ratio of the memory cell cell1 is 68.3%.

Please refer to FIG. 5A again. The effective floating gate area of the memory cell cell4 is equal to 0.28 μm×0.45 μm. Moreover, the effective erase gate area of the memory cell cell4 is equal to 0.45 μm×0.18 μm. Consequently, the floating gate coupling ratio of the memory cell cell1 is 60.9%.

Figure 5B:
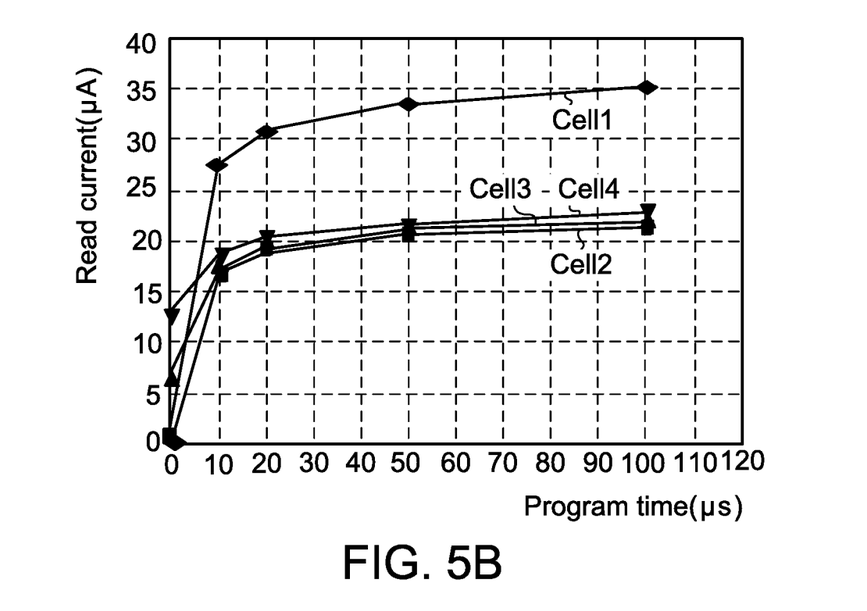

FIG. 5B is a plot illustrating the relationships between the program time and the read current of the memory cell. The memory cell cell1 has the largest effective floating gate area. The effective floating gate areas of the memory cells cell2, cell3 and cell4 are equal. After the identical program bias voltage is provided to program the memory cells cell2, cell3 and cell4 for a program time period of 50 μs, the read current of each of the memory cell2, cell3 and cell4 is about 21 μs, and the highest read current of the memory cell cell1 is about 34 μs.

Since the channel width of the floating gate transistor in the memory cell cell1 is the largest, more hot carriers are injected into the floating gate and the higher magnitude of the read current is generated. Since the channel widths of the floating gate transistors in the memory cells cell2, cell3 and cell4 are smaller, less hot carriers are injected into the floating gate and a smaller magnitude of the read current is generated.

Figure 5C:
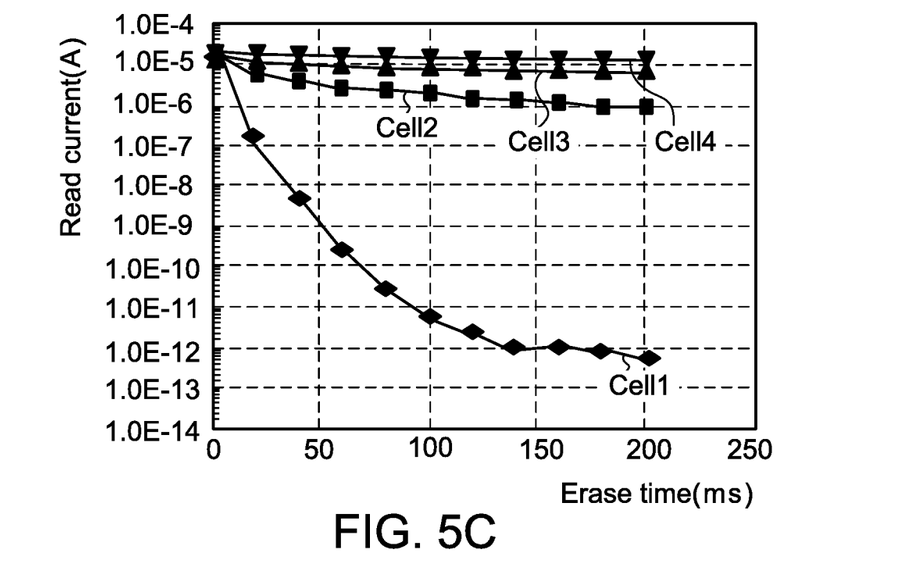

FIG. 5C is a plot illustrating the relationships between the erase time and the read current of the memory cell. The memory cell cell1 has the largest floating gate coupling ratio. The floating gate coupling ratio of the memory cell cell2 is higher than the floating gate coupling ratio of the memory cell cell3. The floating gate coupling ratio of the memory cell cell3 is higher than the floating gate coupling ratio of the memory cell cell4.

After the identical erase bias voltage is provided to erase the memory cells cell2, cell3 and cell4 for an erase time period of 100 ms, the magnitude of the read current generated by the memory cell cell4 is the highest (e.g., about 11 μA), the magnitude of the read current generated by the memory cell cell3 is about 8 μA, the magnitude of the read current generated by the memory cell cell2 is about 2 μA, and the magnitude of the read current generated by the memory cell cell1 is the lowest (e.g., about 8 pA).

In other words, the memory cell cell1 has the highest erase efficiency to eject the greatest amount of hot carriers from the floating gate and generate the lowest read current. The erase efficiencies of the memory cells cell2 and cell3 are inferior. Since the memory cell cell4 has the worse erase efficiency, the smallest amount of hot carriers are ejected from the floating gate and the magnitude of the read current is the highest.

Figure 5D:
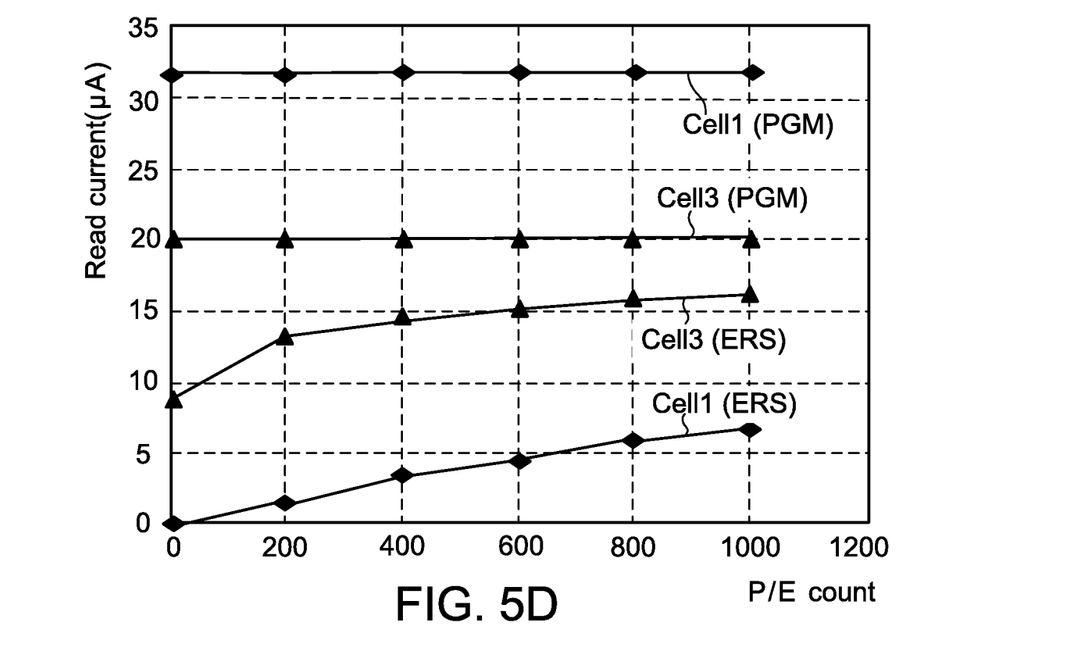

FIG. 5D schematically illustrates the results of the endurance test on the memory cell. As the program/erase (P/E) count increases, the read currents of the memory cells cell1 and cell3 in the erased state increase.

As mentioned above, the memory cell cell1 has the higher read current in the program state and the better erase efficiency, and the memory cells cell3 has the inferior read current in the program state and the inferior erase efficiency. After the program/erase actions have been performed many times, the read current generated by the memory cell cell1 in the programmed state is still higher than the read current generated by the memory cell cell3 in the programmed state, and the read current generated by the memory cell cell1 in the erased state is still lower than the read current generated by the memory cell cell3 in the erased state.

Please refer to FIG. 5D again. The read current generated by the memory cell cell1 in the programmed state is still higher than the read current generated by the memory cell cell3 in the programmed state. The read current generated by the memory cell cell3 in the programmed state is higher than the read current generated by the memory cell cell3 in the erased state. The read current generated by the memory cell cell3 in the erased state is higher than the read current generated by the memory cell cell1 in the erased state.

According to the above characteristics of the memory cells, the present invention provides an erasable programmable non-volatile memory and a sensing method for the erasable programmable non-volatile memory.

Figure 6:
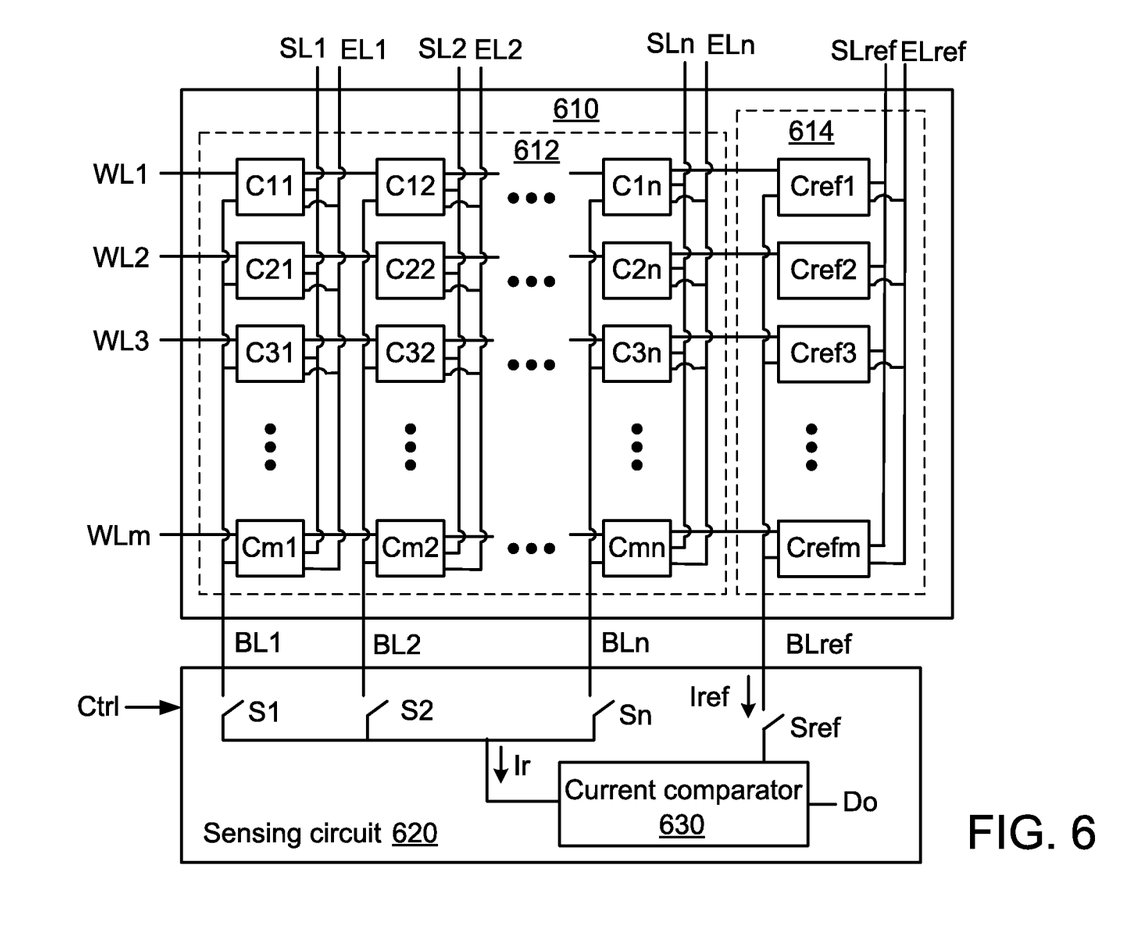
FIG. 6 is a schematic circuit diagram illustrating an erasable programmable non-volatile memory according to a first embodiment of the present invention.

FIG. 6 is a schematic circuit diagram illustrating an erasable programmable non-volatile memory according to a first embodiment of the present invention. The erasable programmable non-volatile memory comprises a memory array 610 and a sensing circuit 620. The memory array 610 comprises a first array region 612 and a second array region 614. The first array region 612 comprises m×n memory cells C11~Cmn. The second array region 614 comprises m×1 memory cells Cref1~Crefm.

The structures of the m×n memory cells C11~Cmn in the first array region 612 are identical. The structures of the m×1 memory cells Cref1~Crefm in the second array region 614 are identical. The structure of each of the m×n memory cells C11~Cmn in the first array region 612 is identical to the structure of the first type memory cell 450 as shown in FIG. 3. The structure of each of the m×1 memory cells Cref1~Crefm in the second array region 614 is identical to the structure of the second type memory cell 460 as shown in FIG. 3.

In this embodiment, read current at the program state and the erase efficiency of each of the m×n memory cells C11~Cmn in the first array region 612 are higher than those of each of the m×1 memory cells Cref1~Crefm in the second array region 614.

The m×n memory cells C11~Cmn and the m×1 memory cells Cref1~Crefm are different types of memory cells. In this context, the m×n memory cells C11~Cmn in the first array region 612 are referred as general memory cells, and the m×1 memory cells Cref1~Crefm in the second array region 614 are referred as reference memory cells.

The memory array 610 comprises m word lines WL1~WLm, (n+1) bit lines BL1~BLn and BLref, (n+1) source lines SL1~SLn and SLref, and (n+1) erase lines EL1~ELn and ELref.

A select gate voltage $V_{SG}$ is provided to the word lines WL1~WLm. A source line voltage $V_{SL}$ is provided to the source lines SL1~SLn and SLref. An erase line voltage $V_{EL}$ is provided to the erase lines EL1~ELn and ELref. A bit line voltage $V_{BL}$ is provided to the bit lines BL1~BLn and BLref.

Each of the word lines WL1~WLm is connected with a corresponding row of (n+1) memory cells. That is, each of the word lines WL1~WLm is connected with n general memory cells of the first array region 612 and one reference memory cell of the second array region 614. The (n+1) memory cells in each row are connected with the (n+1) source lines SL1~SLn and SLref, the (n+1) erase lines EL1~ELn and ELref and the (n+1) bit lines BL1~BLn and BLref, respectively.

For example, the word line WL2 is connected with the n memory cells C21~C2*n* and Cref2 in the second row. The memory cells C21~C2*n* in the first array region 612 are connected with then source lines SL1~SLn, the n erase lines EL1~ELn and the n bit lines BL1~BLn, respectively. The reference memory cell Cref2 in the second array region 614 is connected with the source line SLref, the erase line ELref and the bit line BLref.

The sensing circuit 620 comprises a switch set and a current comparator 630. The switch set comprises (n+1) switches S1~Sn and Sref. According to a control signal Ctrl, one of the switches S1~Sn is controlled to be in a close state, and the other switches of the switches S1~Sn are controlled to be in an open state. The sensing circuit 620 can judge whether the selected general memory cell of the first array region 612 is in the programmed state or the erased state.

During a read action, the select gate voltage $V_{SG}$ is provided to the word line WL2. Consequently, the word line WL2 is activated, and the row of the (n+1) memory cells C21~C2*n* and Cref2 connected with the word line WL2 is a selected row.

For example, if the switch S2 and the switch Sref are in the close state and the other switches are in the open state according to the control signal Ctrl, the general memory cell C22 is the selected general memory cell and the reference memory cell Cref2 is the selected reference memory cell. The selected general memory cell C22 is connected with the current comparator 630 through the bit line BL2. The selected reference memory cell Cref2 is connected with the current comparator 630 through the bit line BLref.

When proper magnitudes of the source line voltage $V_{SL}$ is provided to the source lines SL2 and SLref, the erase line voltage $V_{EL}$ is provided to the erase lines EL2 ELref and the bit line voltage $V_{BL}$ is provided to the bit lines BL2 and BLref, a read current Ir generated by the selected general memory cell C22 is transmitted to the current comparator 630 through the bit line BL2 and a reference current Iref generated by the selected reference memory cell Cref2 is transmitted to the current comparator 630 through the bit line BLref.

According to the result of comparing the read current Ir with a reference current Iref, the current comparator 630 issues an output data signal Do to indicate the storage state of the selected general memory cell C22.

For example, if the read current Ir generated by the selected general memory cell C22 is higher than the reference current Iref, the output data signal Do is in a first logic level state to indicate that the selected general memory cell C22 is in the programmed state. Whereas, if the read current Ir generated by the selected general memory cell C22 is lower than the reference current Iref, the output data signal Do is in a second logic level state to indicate that the selected general memory cell C22 is in the erased state.

As mentioned above, the read current in the program state and the erase efficiency of the selected general memory cell C22 are higher than those of the selected reference memory cell Cref2. Regardless of whether the selected reference memory cell Cref2 is in the programmed state or the erased state, the read current (i.e., the reference current Iref) generated by the reference memory cell Cref2 is in the range between the read current Ir of the selected general memory cell C22 in the programmed state and the read current Ir of the selected general memory cell C22 in the erased state. Consequently, regardless of whether the selected reference memory cell Cref2 is in the programmed state or the erased state, the current comparator 630 generates the output data signal Do to indicate the storage state of the selected general memory cell C22 according to the result of comparing the read current Ir with the reference current Iref.

In the above embodiment, the erase efficiency of the memory cell is determined according to the floating gate coupling ratio. It is noted that numerous modifications and alterations may be made while retaining the teachings of the invention. For example, in case that the structure of the erase gate region is altered, the erase efficiency of the memory cell is correspondingly changed.

Figure 7A:
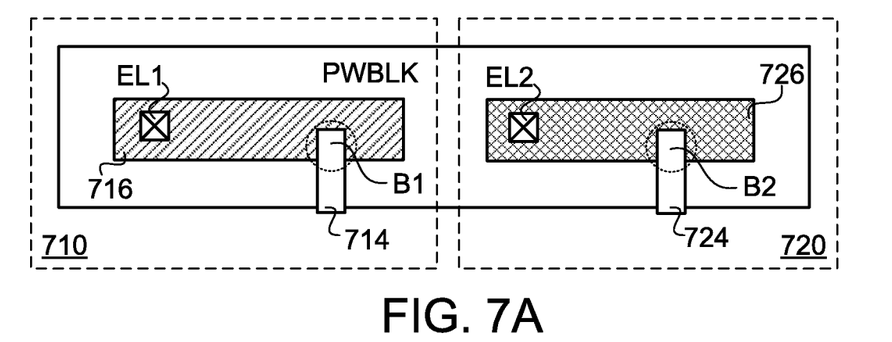
FIGS. 7A, 7B and 7C schematically illustrate three examples of the erase gate region.
Figure 7B:
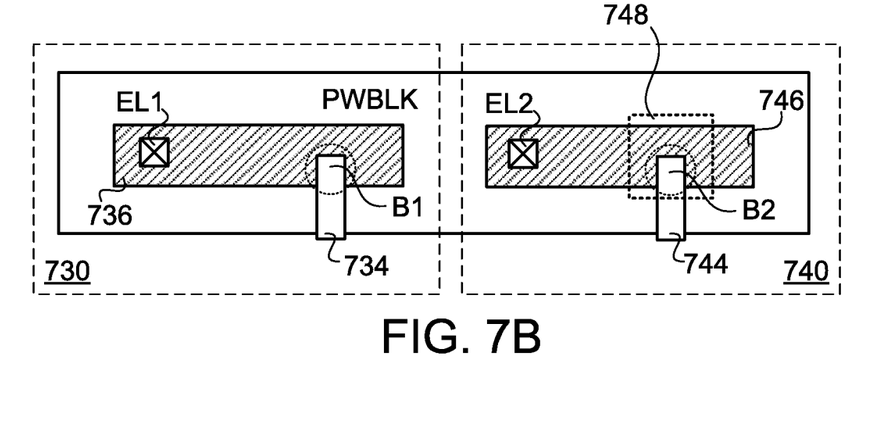
Figure 7C:
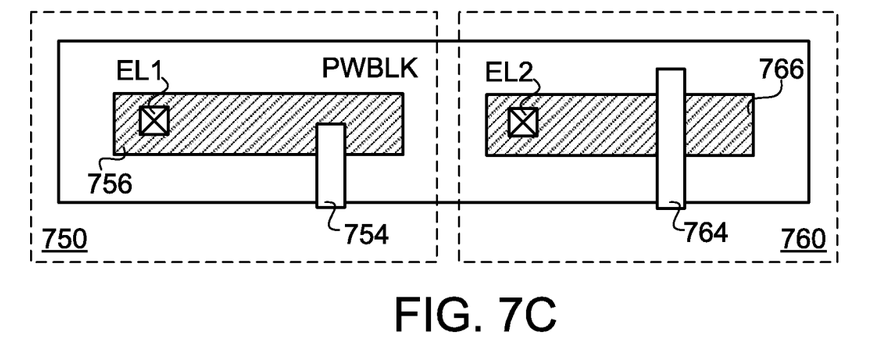

FIGS. 7A, 7B and 7C schematically illustrate three examples of the erase gate region.

As shown in FIG. 7A, the memory cell 710 is a general memory cell, and the memory cell 720 is a reference memory cell. The floating gate 714 of the memory cell 710 is extended over an n-type doped region 716. The floating gate 724 of the memory cell 720 is extended over an n-type doped region 726.

For example, the effective erase gate area B1 of the memory cell 710 and the effective erase gate area B2 of the memory cell 720 are equal. In case that the dopant concentration of the n-type doped region 716 and the dopant concentration of the n-type doped region 726 are different, the erase efficiency of the memory cell 710 and the erase efficiency of the memory cell 720 are different. For example, if the dopant concentration of the n-type doped region 716 is higher than the dopant concentration of the n-type doped region 726, the erase efficiency of the memory cell 710 is higher than the erase efficiency of the memory cell 720.

As shown in FIG. 7B, the memory cell 730 is a general memory cell, and the memory cell 740 is a reference memory cell. The floating gate 734 of the memory cell 730 is extended over an n-type doped region 736. The floating gate 744 of the memory cell 740 is extended over an n-type doped region 746. The memory cell 740 further comprises a metal layer 748 to cover the n-type doped region 746 and the floating gate 744 in the erase gate region. However, the metal layer 748 is not in contact with the n-type doped region 746 and the floating gate 744.

For example, the effective erase gate area B1 of the memory cell 730 and the effective erase gate area B2 of the memory cell 740 are equal. Since the metal layer 748 is located over the erase gate region, the electric field distribution of the erase gate region is affected and the erase efficiency of the memory cell 740 is reduced. Consequently, the erase efficiency of the memory cell 730 is higher than the erase efficiency of the memory cell 740.

As shown in FIG. 7C, the memory cell 750 is a general memory cell, and the memory cell 760 is a reference memory cell. The floating gate 754 of the memory cell 750 is extended over an n-type doped region 756. The floating gate 764 of the memory cell 760 is extended over an n-type doped region 766 and spanned over the n-type doped region 766.

Since the floating gate 764 of the memory cell 760 is spanned over the n-type doped region 766, the point discharge efficiency of the floating gate 764 and the floating gate coupling ration are affected. In such way, the erase efficiency of the memory cell 760 is reduced. Consequently, the erase efficiency of the memory cell 750 is lower than the erase efficiency of the memory cell 760.

Figure 8:
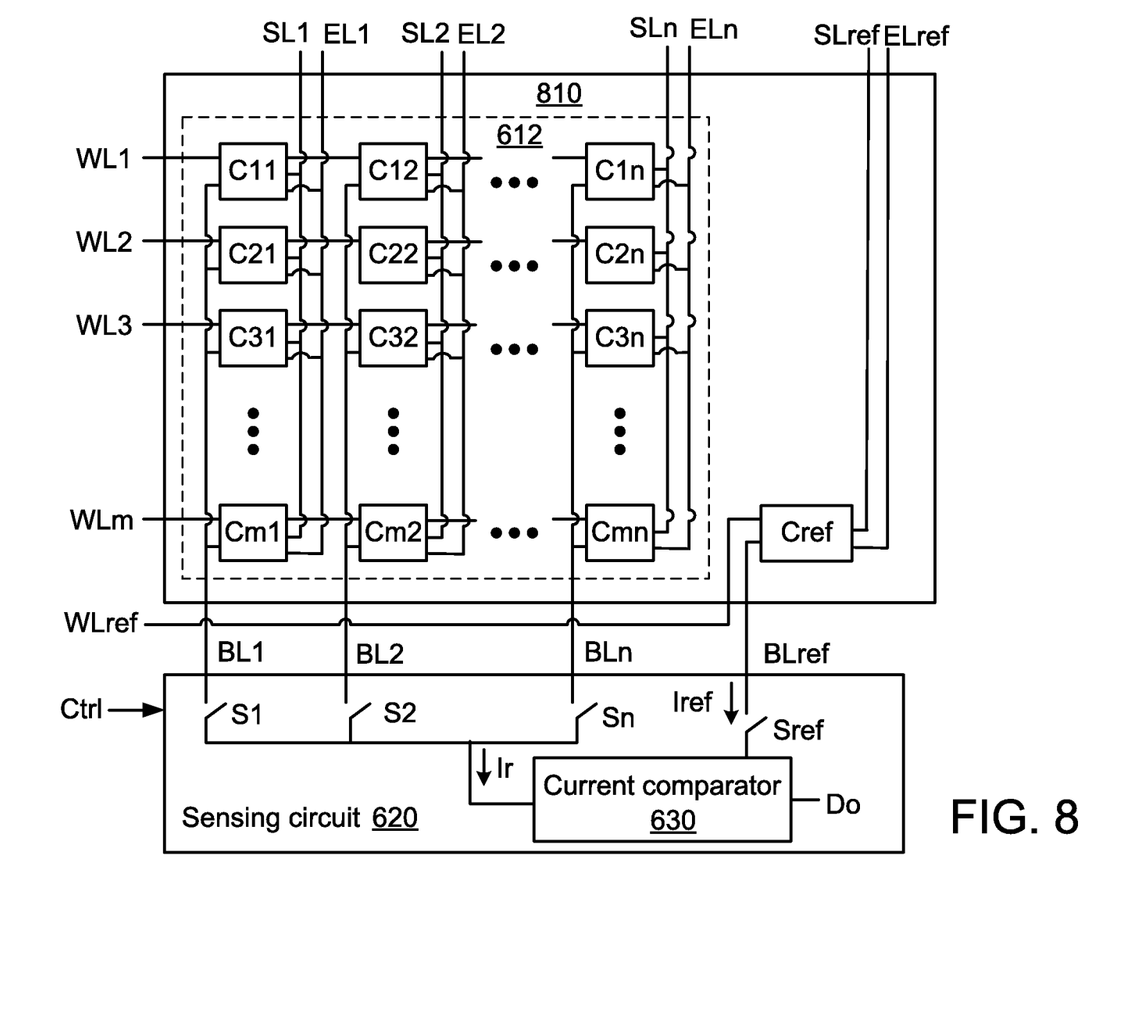
FIG. 8 is a schematic circuit diagram illustrating an erasable programmable non-volatile memory according to a second embodiment of the present invention.

In the embodiment of FIG. 6, the second array region 614 comprises m×1 reference memory cells Cref1~Crefm. In some embodiment, the m×1 memory cells Cref1~Crefm is replaced by a single reference memory cell. FIG. 8 is a schematic circuit diagram illustrating an erasable programmable non-volatile memory according to a second embodiment of the present invention. In comparison with the first embodiment, the erasable programmable non-volatile memory of the second embodiment is not equipped with the second array region 614. In contrast, the second array region is replaced by a single reference memory cell Cref. For succinctness, only the relationships between the reference memory cell Cref and the associated components and the operating principles will be described as follows.

Please refer to the FIG. 8. In the memory array 810, the reference memory cell Cref is connected with the reference word line WLref, the source line SLref and the erase line ELref. During the read action, the select gate voltage $V_{SG}$ is provided to one of the m word lines WL1~WLm and the reference word line WLref. Consequently, the corresponding word line ad the reference word line WLref are activated. Meanwhile, a selected general memory cell and a selected reference memory cell Cref of the memory array 810 are determined. Consequently, a read current Ir generated by the selected general memory cell and a reference current Iref generated by the selected reference memory cell are transmitted to the current comparator 630. According to the result of comparing the read current Ir with a reference current Iref, the current comparator 630 issues an output data signal Do to indicate the storage state of the selected general memory cell.

From the above descriptions, the present invention provides an erasable programmable non-volatile memory. The erasable programmable non-volatile memory comprises a memory array and a sensing circuit. The memory cell array comprises a general memory cell and a reference memory cell. The general memory cell and the reference memory cell are connected with a word line. The read current in the program state and the erase efficiency of the general memory cell are higher than those of the reference memory cell. When the read action is performed and the word line is activated, the sensing circuit receives the read current from the general memory cell and the reference current from the reference memory cell. In addition, the sensing circuit generates an output data signal to indicate the storage state of the general memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable non-volatile memory, comprising:
a memory array comprising a first array region and a second array region, wherein a first word line is connected with a first row of n general memory cells in the first array region, and the first word line is connected with a first reference memory cell in the second array region, wherein the memory array further comprises n general bit lines, n general erase lines, n general source lines, a reference bit line, a reference erase line and a reference source line, wherein the first row of n general memory cells are respectively connected with the n general bit lines, the n general erase lines and the n general source lines, and the first reference memory cell is connected with the reference bit line, the reference erase line and the reference source line, wherein a read current in the program state of each general memory cell is higher than a read current in the program state of the first reference memory cell, and an erase efficiency of each general memory cell is higher than an erase efficiency of the first reference memory cell; and
a sensing circuit comprising a switch set and a current comparator, wherein the switch set is connected with the n general bit lines and the reference bit line, and the current comparator is connected with the switch set,
wherein when a read action is performed and the first word line is activated, one of the n general bit lines and the reference bit line are connected with the current comparator through the switch set according to a control signal, so that one of the first row of n general memory cells is determined as a first selected general memory cell and the first reference memory cell is determined as a first selected reference memory cell, wherein the first selected general memory cell generates a first read current to the current comparator, the first selected reference memory cell generates a first reference current to the current comparator, and the current comparator generates an output data signal according to the first reference current and the first read current;
wherein a first general memory cell of the n general memory cells comprises:
a first p-type doped region connected with a first general source line;
a second p-type doped region;
a third p-type doped region connected with a first general bit line;
a first n-type doped region connected with a first general erase line;
a first select gate connected with the first word line and located over a region between the first p-type doped region and the second p-type doped region, wherein a first select transistor is defined by the first select gate, the first p-type doped region and the second p-type doped region collaboratively; and a first floating gate located over a region between the second p-type doped region and the third p-type doped region, wherein a first floating gate transistor is defined by the first floating gate, the second p-type doped region and the third p-type doped region collaboratively;

wherein a first overlapping region of the first floating gate overlying a channel region of the first floating gate transistor is a first effective floating gate area, the first floating gate is extended to the first n-type doped region, and a second overlapping region of the first floating gate overlying the first n-type doped region has a first effective erase gate area, wherein a percentage of the first effective floating gate area divided by the sum of the first effective floating gate area and the first effective erase gate area is defined as a first floating gate coupling ratio of the first general memory cell.

2. The erasable programmable non-volatile memory as claimed in claim 1, wherein a second word line of the memory array is connected with a second row of n general memory cells in the first array region, and the second word line is connected with a second reference memory cell in the second array region, wherein the second row of n general memory cells are respectively connected with the n general bit lines, the n general erase lines and the n general source lines, and the second reference memory cell is connected with the reference bit line, the reference erase line and the reference source line, wherein when the read action is performed and the second word line is activated, one of the n general bit lines and the reference bit line are connected with the current comparator through the switch set according to the control signal, so that one of the second row of n general memory cells is determined as a second selected general memory cell and the second reference memory cell is determined as a second selected reference memory cell, wherein the second selected general memory cell generates a second read current to the current comparator, the second selected reference memory cell generates a second reference current to the current comparator, and the current comparator generates the output data signal according to the second reference current and the second read current.

3. The erasable programmable non-volatile memory as claimed in claim 2, wherein if the second reference current is higher than the second read current, the second selected general memory cell is in an erased state, wherein if the second reference current is lower than the second read current, the second selected general memory cell is in a programmed state.

4. The erasable programmable non-volatile memory as claimed in claim 3, wherein the second selected reference memory cell is in the programmed state or the erased state.

5. The erasable programmable non-volatile memory as claimed in claim 1, wherein if the first reference current is higher than the first read current, the first selected general memory cell is in an erased state, wherein if the first reference current is lower than the first read current, the first selected general memory cell is in a programmed state.

6. The erasable programmable non-volatile memory as claimed in claim 5, wherein the first selected reference memory cell is in the programmed state or the erased state.

7. The erasable programmable non-volatile memory as claimed in claim 1, wherein the first reference memory cell comprises:

a fourth p-type doped region connected with a first reference source line;

a fifth p-type doped region;

a sixth p-type doped region connected with the first reference bit line;

a second n-type doped region connected with the first reference erase line;

a second select gate connected with the first word line and located over a region between the fourth p-type doped region and the fifth p-type doped region, wherein a second select transistor is defined by the second select gate, the fourth p-type doped region and the fifth p-type doped region collaboratively; and a second floating gate located over a region between the fifth p-type doped region and the sixth p-type doped region, wherein a second floating gate transistor is defined by the second floating gate, the fifth p-type doped region and the sixth p-type doped region collaboratively;

wherein a third overlapping region of the second floating gate overlying a channel region of the second floating gate transistor is a second effective floating gate area, the second floating gate is extended to the second n-type doped region, and a fourth overlapping region of the second floating gate overlying the second n-type doped region has a second effective erase gate area, wherein a percentage of the second effective floating gate area divided by the sum of the second effective floating gate area and the second effective erase gate area is defined as a second floating gate coupling ratio of the first reference memory cell.

8. The erasable programmable non-volatile memory as claimed in claim 7, wherein the first effective floating gate area is larger than the second effective floating gate area.

9. The erasable programmable non-volatile memory as claimed in claim 8, wherein the first floating gate coupling ratio is higher than the second floating gate coupling ratio.

10. The erasable programmable non-volatile memory as claimed in claim 8, wherein a dopant concentration of the first n-type doped region is higher than a dopant concentration of the second n-type doped region.

11. The erasable programmable non-volatile memory as claimed in claim 8, wherein the first reference memory cell further comprises a metal layer to cover the fourth overlapping region, wherein the metal layer is not in contact with the second n-type doped region and the second floating gate.

12. The erasable programmable non-volatile memory as claimed in claim 8, wherein the second floating gate is extended over the second n-type doped region and spanned over the second n-type doped region.

* * * * *